US008749337B2

(12) United States Patent
Baram et al.

(10) Patent No.: US 8,749,337 B2
(45) Date of Patent: Jun. 10, 2014

(54) MICRO COIL APPARATUS AND MANUFACTURING METHODS THEREFOR

(75) Inventors: Adi Baram, Yoqneam (IL); Matan Naftali, Moshav Aloney-Aba (IL); Sharon Hornstein, Pardes Hanna (IL); Inbal Herer, Kibbutz Ramat Hashofet (IL); Menashe Yehiel, Moshav Yogev (IL)

(73) Assignee: Maradin Technologies Ltd., Yoqneam (IL)

( * ) Notice: Subject to any disclaimer, the term of this patent is extended or adjusted under 35 U.S.C. 154(b) by 0 days.

(21) Appl. No.: 13/422,082

(22) Filed: Mar. 16, 2012

(65) Prior Publication Data

US 2012/0235779 A1  Sep. 20, 2012

Related U.S. Application Data

(63) Continuation-in-part of application No. PCT/IL2010/000570, filed on Jul. 15, 2010.

(60) Provisional application No. 61/242,813, filed on Sep. 16, 2009.

(51) Int. Cl.
*H01F 5/00* (2006.01)
*H01F 27/30* (2006.01)
*H01F 27/28* (2006.01)

(52) U.S. Cl.
USPC ........... 336/200; 336/205; 336/223; 336/184; 336/182

(58) Field of Classification Search
USPC .................. 336/200, 205, 223, 184, 182, 198
See application file for complete search history.

(56) References Cited

U.S. PATENT DOCUMENTS

| 1,899,720 | A | * | 2/1933 | Putman | 336/185 |
| 4,818,966 | A | | 4/1989 | Miyamoto et al. | |
| 5,111,169 | A | * | 5/1992 | Ikeda | 333/181 |
| 5,521,573 | A | * | 5/1996 | Inoh et al. | 336/180 |
| 5,543,956 | A | | 8/1996 | Nakagawa et al. | |
| 5,583,474 | A | | 12/1996 | Mizoguchi et al. | |
| 5,610,433 | A | | 3/1997 | Merrill et al. | |
| 5,711,912 | A | | 1/1998 | Chatterjee et al. | |
| 5,724,015 | A | | 3/1998 | Tai et al. | |
| 5,912,608 | A | | 6/1999 | Asada | |
| 6,171,886 | B1 | | 1/2001 | Ghosh et al. | |
| 6,493,861 | B1 | | 12/2002 | Li et al. | |
| 6,535,098 | B1 | | 3/2003 | Yeo et al. | |
| 7,486,168 | B2 | * | 2/2009 | Kim | 336/200 |
| 2005/0275497 | A1 | * | 12/2005 | Ramadan et al. | 336/200 |

(Continued)

FOREIGN PATENT DOCUMENTS

WO  2005036567 A2  4/2005
WO  2008072248 A2  6/2008

OTHER PUBLICATIONS

Sitaram R Arkalgud et al., "Leading Edge 3D Technology for High Volume Manufacturing" in VLSI Tech.Dig.,2009, p. 68-69.

(Continued)

*Primary Examiner* — Alexander Talpalatski
*Assistant Examiner* — Kazi Hossain
(74) *Attorney, Agent, or Firm* — Browdy and Neimark, PLLC

(57) ABSTRACT

A method for manufacturing a conductive coil, the method comprising using a semiconductor fabrication process (e.g. TSV) to manufacture a coil, typically a planar spiral conductive coil.

18 Claims, 19 Drawing Sheets

(56) References Cited

U.S. PATENT DOCUMENTS

2009/0001510 A1* 1/2009 Matz et al. .................. 257/531
2009/0102059 A1   4/2009 Ishii
2010/0289610 A1* 11/2010 Jacobson et al. ............ 336/84 C

OTHER PUBLICATIONS

K-W Lee et al., "3D Heterogeneous Opto-Electronic Integration Technology for System-on-Silicon (SOS)" in IEDM Tech. Dig., 2009, p. 531-534.

Wei-Chung Lo et al., "TSV and 3D Wafer Bonding Technologies for Advanced Stacking System and Application at ITRI" in IEDM Tech. Dig., 2009, p. 70-71 (22.2.1-22.2.4).

D. Y. Chen et al. "Enabling 3D-IC foundry technologies for 28 nm node and beyond: through-silicon-via integration with high throughput die-to-wafer stacking" in IEDM Tech. Dig., 2009, p. 353-356 (14.3.1-14.3.4).

J. H. Klootwijk et al., "Ultrahigh Capacitance Density for Multiple ALD-Grown MIM Capacitor Stacks in 3-D Silicon" in IEEE EDL 2008 vol. 29, p. 740-742.

Mitsumasa Koyanagi., "New 3D Integration Technology and 3D System LSIs" in VLSI Tech. Dig. 2009, p. 64-67.

H.Y. Li et al Ultra-Compact Micro Coil via Multi-Layers Stacking of Dense TSV Coils for MEMS Application, Jan. 25, 2012.

Guerin Louis et al.,"High aspect ratio planar coils embedded in SU8 photoepoxy for MEMs applications", vol. XII, No. 1, Sep. 13, 1998, pp. 11-14, XP008115449.

* cited by examiner

| Step | Process | Cross section |
|---|---|---|
| 310 | Performing deep Si etch | |
| 320 | Passivation of the etched trenches | |
| 330 | Seed layer process | |
| 340 | Electroplating | |
| 350 | Front side polishing operation | |
| 360 | Front side passivation | |

FIG. 2A

| Step | Process | Cross section |
|---|---|---|
| 370 | Open contact in the passivation layer | |
| 380 | Wafer polish/etch | |
| 390 | Back side passivation | |
| 400 | Open contact in the passivation layer | |
| 410 | BGA process | |

FIG. 2B

— conductive seed layer
▓ Conductive layer of electroplating process
◻ passivation layer.
-- Conductive seed layer
▤ Bulk e.g. Si or Polymer
◻ air

FIG. 2C

| Location | Coil resistance |
|---|---|
| Top | 0.9Ohm |
| Center | 0.9Ohm |
| Bottom | 0.82Ohm |
| Left | 0.92Ohm |
| Right | 0.86Ohm |

Fig. 16

| Coil No. | Coil 1 | Coil 2 | Coil 3 | Coil 4 |
|---|---|---|---|---|
| Resistance | 7.8Ohm | 8.3Ohm | 7.5Ohm | 7.72Ohm |

Fig. 17

| Step | Process | Cross section |
|---|---|---|
| 1310 | Performing deep Si etch | |
| 1320 | Passivation of the etched trenches | |
| 1330 | Seed layer process | |
| 1340 | Electroplating | |
| 1350 | Front side polishing operation | |
| 1360 | Front side passivation | |

FIG. 18A

| Step | Process | Cross section |
|------|---------|---------------|
| 1370 | Open contact in the passivation layer | |
| 1380 | Wafer polish/etch | |
| 1390 | Back side passivation | |
| 1400 | Open contact in the passivation layer | |
| 1410 | BGA process | |

FIG. 18B

— Conductive seed layer
▨ Conductive layer of electroplating process
◇ Passivation layer.
-- Passivation seed layer
☰ Bulk e.g. Si or Polymer
☐ Air

FIG. 18C

SECTION A-A

▨ Conductive material

▦ Bulk e.g. Si or Polymer

☐ Air

| Step | Process | Cross section |
|------|---------|---------------|
| 1305 | Patterning (e.g. Photolithography mask or -beam lithography) | |
| 1420 | repeat steps 1310 – 1410 once (to generate a single coil) or more times (for a plurality of coils) | |
| 1430 | stack the coils and create connections between the "floors" | |

FIG. 20A

| Step | Process | Cross section |
|---|---|---|
| 1440 | insert a ferromagnet into the core formed by the central portion of the stack of spirals | |
| 1450 | Generate connections between the stack and the circuit, voltage source etc. Use stack to generate flux to drive application specific structure e.g. micro-mirror of micro-projector | in / out |

Pattern Formation (Photolithography process)

Ferromagnetic material

MICRO COIL APPARATUS AND MANUFACTURING METHODS THEREFOR

CROSS-REFERENCE TO RELATED APPLICATIONS

This is a continuation-in-part of PCT Application No. PCT/IL2010/000570, entitled "Micro coil apparatus and manufacturing methods therefor," the entire contents of which are hereby incorporated by reference.

FIELD OF THE INVENTION

The present invention relates to the field of micro-electro-mechanical systems (MEMS) and to micro-coil apparatus.

BACKGROUND OF THE INVENTION

State of the art micro-coil apparatus and related technologies are described in the following publications and documents:
1. U.S. Pat. No. 5,724,015 to Tai et al.
2. U.S. Pat. No. 6,535,098 to Yeo et al.
3. U.S. Pat. No. 6,493,861 to Li et al.
4. U.S. Pat. No. 4,818,966 to Miyamoto et al.
5. U.S. Pat. No. 5,711,912 to Chatterjee et al.
6. U.S. Pat. No. 5,610,433 to Merrill et al.
7. U.S. Pat. No. 5,912,608 to Asada.
8. U.S. Pat. No. 6,171,886 to Ghosh et al
9. U.S. Pat. No. 5,543,956 to Nakagawa et al
10. Published PCT Application WO/2008/072248 to Ramot
11. US Patent Application 2005275497 to Ramadan et al.
12. US Patent Application 2009001510 to Matz et al.
13. Published PCT Application WO/2005/036567 to White et al.
14. U.S. Pat. No. 5,583,474 to Mizoguchi et al.
15. US Patent Application 2009/0102059 to Ishii et al.
16. PCT Patent Application No. PCT/IL2008/000743 "Gimbaled scanning micro-mirror apparatus" was published on Dec. 10, 2009.

Since image sensor production has been achieved using TSV technology, more and more TSV technology development and demonstration of different function block integration are reported, e.g. in:

Sitaram R Arkalgud et al., in VLSI Tech. Dig., 2009, p. 68
K-W Lee et al., in IEDM Tech. Dig., 2009, p. 531.
Wei-Chung Lo et al., in IEDM Tech. Dig., 2009, p. 70
3D interconnects by the Cu TSV are described in D. Y. Chen et al., in IEDM Tech. Dig., 2009, p. 353. TSV technology can be designed as a functional device. For example, J. H. Klootwijk et al., in IEEE EDL 2008 Vol. 29, p. 740, reported TSV designed at ultra-high capacitance density. Another important application of TSV technology is the integration of different functional devices e.g. as described in Mitsumasa Koyanagi, in VLSI Tech. Dig. 2009, p. 64.

The disclosures of all publications and patent documents mentioned in the specification, and of the publications and patent documents cited therein directly or indirectly, are hereby incorporated by reference.

SUMMARY OF CERTAIN EMBODIMENTS OF THE INVENTION

Many applications employ coils as electronic devices. In particular, there are applications with the need of very small coils (i.e., micro-coils) to be operated as electrical inducers for various electrical circuits or as part of very small electro-magneto apparatuses. One such application is a coil for the inductance of magnetic flux for a MEMS micro-electro-magneto actuator.

Electro-magneto actuators offer numerous advantages in realizing micro-actuators for many applications. Their high force-density, resulting in a device that can operate in extreme conditions, along with their linear electro-mechanical response and small size, is advantageous in many applications. In such applications, coils may be critical components as they determine the magnetic flux and inductance of the actuator results in an operating regime.

There is thus provided, in accordance with certain embodiments of the present invention, an electric coil device comprising a spiral comprising a plurality of electro-conductive turns and an isolation layer between the turns, the isolation layer comprising a spiral trench formed of a surrounding electrically isolating bulk, the electro-conductive turns comprising an electro-conductive material at least partly filling the spiral trench; and Connection feeds in and out of the spiral.

Further in accordance with certain embodiments of the present invention, the bulk is formed of one of the following group of materials: Silicon, Pyrex, and Polymer.

Also provided, in accordance with certain embodiments of the present invention, is electronic circuitry apparatus including a coil device as described above.

Further provided, in accordance with certain embodiments of the present invention, is electronic circuitry apparatus as described above which includes a plurality of coils and is operative to induce electromagnetic flux coupling.

Further provided, in accordance with certain embodiments of the present invention, is multi-level electrical coil apparatus comprising a stack of electrically connected electric coil devices as described above.

Yet further provided, in accordance with certain embodiments of the present invention, is a method for manufacturing an electric coil device, the method comprising providing a spiral comprising a plurality of electro-conductive turns and an isolation layer between the turns, including forming the isolation layer by forming a spiral trench of a surrounding electrically isolating bulk, and forming the electro-conductive turns by at least partly filling the spiral trench with an electro-conductive material; and providing connection feeds in and out of the spiral.

Further in accordance with certain embodiments of the present invention, the spiral trench is formed by micromachining the bulk.

Still further in accordance with certain embodiments of the present invention, the apparatus also comprises isolated electrical feeds between the layers which are formed by micromachining.

Additionally in accordance with certain embodiments of the present invention, an air gap which is generally parallel to the turns, is provided in the conductive material.

Further in accordance with certain embodiments of the present invention, the connection feeds are formed by Through Silicon Via (TSV) technology.

Still further in accordance with certain embodiments of the present invention, the trench is completely filled with the electro-conductive material.

Further in accordance with certain embodiments of the present invention, a BGA (ball grid array) process is used to connect the coil devices.

Still further in accordance with certain embodiments of the present invention, the method also uses a Silicon etch process to form the spiral trench.

Additionally in accordance with certain embodiments of the present invention, the bulk comprises bulk Silicon patterned using deep Si etch according to at least one spiral geometry specification, the turns are isolated, the coils are metallized; and in and out connection feeds are patterned at two ends of the spiral.

Further in accordance with certain embodiments of the present invention, the connection feeds are formed by micromachining.

Still further in accordance with certain embodiments of the present invention, the coils are metallized using a seed layer process, an electroplating process and a front side polishing process.

Additionally in accordance with certain embodiments of the present invention, at least one step uses a semiconductor fabrication process.

Further in accordance with certain embodiments of the present invention, at least one step uses a TSV semiconductor fabrication process.

Still further in accordance with certain embodiments of the present invention, the spiral geometry specification includes at least one of the following characteristics of the spiral: cross-section of each turn, number of turns, and pitch.

Yet further in accordance with certain embodiments of the present invention, the trench has spiral walls and the air gap is provided by deposition of the conductive material only adjacent the spiral walls rather than in the entirety of the trench.

Still further in accordance with certain embodiments of the present invention, the spiral has a central head end and a peripheral tail end and wherein the using includes fabricating at least one electrical connector by generating at least one through-silicon via for the spiral.

Additionally in accordance with certain embodiments of the present invention, the method also comprises using the semiconductor fabrication process to manufacture a second planar spiral conductive coil thereby to define at least first and second through-silicon vias for the first and second coils respectively, and using the vias to electrically connect the head end of the first coil to the tail end of the second coil.

Further in accordance with certain embodiments of the present invention, the semiconductor fabrication process is used to manufacture a first plurality of clockwise spiral conductive coils and a second plurality of counterclockwise spiral conductive coils thereby to define through-silicon vias for the coils, and using the vias to at least once electrically connect a head end of an individual one of the first plurality of clockwise coils to an end of an individual one of the second plurality of counterclockwise coils and to connect the head end of the individual one of the second plurality of counterclockwise coils to an end of another individual one of the first plurality of clockwise coils and to generate a stack of conductive coils in which each pair of adjacent coils includes a clockwise coil and a counter-clockwise coil.

Further in accordance with certain embodiments of the present invention, the method also comprises connecting at least one through-silicon via to a controlling electronic circuit.

Still further in accordance with certain embodiments of the present invention, the coil comprises trenches defined in a bulk and wherein the trenches are at least 40 microns deep Additionally in accordance with certain embodiments of the present invention, the spiral trench has spiral walls and wherein providing a spiral comprises extending effective coil length by manufacturing a pair of intertwined spiral conductive coils, wherein the trench has a trench cross-sectional width and the walls are coated with first and second conductive coatings respectively which are together thinner than the trench cross-sectional width thereby to form a non-conductive gap between the conductive coatings so as to define the intertwined spiral conductive coils.

Further in accordance with certain embodiments of the present invention, the apparatus comprises an electromagnetic actuator.

Still further in accordance with certain embodiments of the present invention, the connection feeds are patterned using Front side passivation thereby to generate a front passivation layer, Opening of a contact in the front passivation layer, Wafer polishing/etching, Back side passivation thereby to generate a back passivation layer, and Opening a contact in the back passivation layer.

Further in accordance with certain embodiments of the present invention, the spiral comprises a planar spiral.

Still further in accordance with certain embodiments of the present invention, the coating of the walls is effected by an electroplating process.

The turns of the spiral planar coil provided herein may be round e.g. generally circular but may also be of any other suitable shape such as oblong which may include straight line segments.

In accordance with still other embodiments of the present invention, the coil comprises trenches defined in a bulk and the trenches are at least 5 microns deep and are up to 1000 microns deep. The depth of the trench is dependent on the thickness of the bulk, which conventionally varies up to 1000 microns. However, this depends on the manufacturing process used hence is not intended to be limiting.

According to some embodiments, the trench varies in at least one of cross-sectional width and cross-sectional height (the terms "height" and "depth" are used herein generally simultaneously). For example, it may be the case that the trench varies in height and includes a peripheral end portion, an intermediate portion and a central end portion adjacent the spiral's center point, and the cross-sectional height of the intermediate portion differs from the cross-sectional heights, or common cross-sectional height if equal, of the peripheral and central portions.

Typically, the aspect ratio along the trench varies e.g. from 1:1 or 2:1 to 5:1, where aspect ratio is defined as the ratio of trench cross-sectional height to width.

A particular advantage of certain embodiments is that the intensity of the electro-magnetic flux is increased due to providing a core extending along the entire length of a stack of connected coils. Such a long core is capable of housing a relatively long hence massive ferromagnetic body generating electro-magnetic flux. The electro-magnetic force/moment resulting from this structure is thus enhanced, being an increasing function of the mass of the ferromagnetic body. Simultaneously, according to certain embodiments, the footprint remains small since the spirals or coils are stacked vertically rather than being positioned side by side. Typically, the number of spirals in the stack is anywhere from 1 to 20 or more, depending how much electromagnetic flux is required for the application.

It is appreciated that coils may be connected to one another either in parallel or in series.

The connection feeds are typically formed such that each coil has at least one first connection feed in the upper surface of the substrate and at least one second connection feed at the bottom surface of the substrate. A particular advantage is that the connection of the coil to a voltage source can be selectably effected from either of the coil's upper or lower surfaces.

Example: The widths of each of the portions that comprise the trench may be as follows: 10-50 microns width for the peripheral portion, 5-100 microns for the intermediate portion and 10-50 microns for the central portion. The height of these portions may be determined by the aspect-ratio. For example, given a 1:1 aspect ratio, the heights may be: 10-50 microns for both the peripheral and the central portions, and 5-100 microns height for the intermediate portion. For a 5:1 aspect ratio, the heights may be: 50-250 microns for both the peripheral and the central portions, and 25-500 microns for the intermediate portion. For a 10:1 aspect ratio, the heights may be: 100-500 microns for both the peripheral and the central portions, and 50-1000 microns for the intermediate portion. It is appreciated that higher aspect ratios are possible and may be used to create different dimensions of the trenches.

The ratio between the peripheral and central portions to the intermediate portion may be selected dependent on the aspect ratio used to create these portions and/or on the application that the coil is designed for. For applications that employ intensive electro-magnetic flux, the length of the intermediate portion of the coil may be much larger than the coil's two end portions (its peripheral and central portions). In this case, the ratio may be taken to an extreme of peripheral length and central length <1% and the intermediate length >99% from the entire length. However, for applications where the intensity of the flux is of least importance, and/or where the footprint of each coil should be as small as possible, and when stacking of coils is used to enhance the overall flux, then the ratio may be changed to the other extreme, say peripheral and central lengths may be 15% each and the intermediate length may be 70%.

The metal filling process is typically determined by the application and/or the manufacturing process. The width of the metal layer may be 1 micron or even less or may entirely fill the trench width. So, if a 10 micron width is used, and the metal fill is 1 micron (at each side of the trench), an 8 micron air gap is created. For wider trenches the air gap may be much higher. Also, if the metal filling is thicker, say 4 microns width, an air gap of 2 microns is created.

According to some embodiments, some or all of the above parameters may be controlled to a considerable extent or absolutely such that all of the above values are merely exemplary.

In accordance with an embodiment of the presently disclosed subject matter, there is provided a device wherein the trench which varies in height includes a peripheral portion, an intermediate portion and a central portion and wherein the cross-sectional height of the intermediate portion is greater than the cross-sectional heights, e.g. common cross-sectional height if equal, of the peripheral and central portions.

In accordance with an embodiment of the presently disclosed subject matter, there is further provided a method wherein the providing a spiral comprises providing a single photolithography mask including a spiral having a peripheral portion, an intermediate portion and a central portion each having a cross-sectional width and wherein the cross-sectional width of the intermediate portion is greater than the cross-sectional widths of at least one of the peripheral and central portions.

In accordance with an embodiment of the presently disclosed subject matter, there is yet further provided a method comprising bounding at least one relatively shallow portion of the spiral trench at its bottom by a substrate and generating a through-hole from at least one relatively deep portion, defining a depth, of the spiral by filling the entire depth of the relatively deep portion of the spiral trench with metal.

In accordance with an embodiment of the presently disclosed subject matter, there is yet further provided an apparatus wherein the spiral in each electric coil device has top and bottom main surfaces and defines a hollow portion at its center extending through the top and bottom main surfaces such that the stack has a hollow center comprising a concatenation of the hollow portions of each of the electric coil devices as stacked.

In accordance with an embodiment of the presently disclosed subject matter, there is yet further provided an apparatus comprising a ferromagnetic structure residing in the hollow center of the stack and extending along a plurality of the electric coil devices in the spiral.

In accordance with an embodiment of the presently disclosed subject matter, there is yet further provided a method wherein the cross-sectional width of the intermediate portion is greater than the cross-sectional widths of both of the peripheral and central portions.

In accordance with an embodiment of the presently disclosed subject matter, there is yet further provided a method wherein the cross-sectional widths of the peripheral and central portions are equal.

In accordance with an embodiment of the presently disclosed subject matter, there is yet further provided a device wherein a plurality of connecting points are provided on at least one of the upper surface of the trench and the lower surface thereof, thereby providing diverse options for connectivity.

In accordance with an embodiment of the presently disclosed subject matter, there is yet further provided a device wherein connecting points are provided at both ends of the trench on both the upper and lower surfaces of the trench, thereby providing diverse options for connectivity.

In accordance with an embodiment of the presently disclosed subject matter, there is yet further provided an apparatus which includes electrical connection apparatus between the stack and an electrical circuit, thereby to generate an actuator.

In accordance with an embodiment of the presently disclosed subject matter, there is yet further provided a method wherein the spiral is formed by a spiral fabrication process and wherein BGA (ball grid array) is used to connect a plurality of coil devices each formed by the spiral fabrication process and wherein said BGA is formed integrally within the spiral fabrication process rather than by a separate fabrication process.

In accordance with an embodiment of the presently disclosed subject matter, there is yet further provided a method comprising using at least one of the peripheral and central portions as a connection feed to at least one of a voltage source and a circuit.

BRIEF DESCRIPTION OF THE DRAWINGS

Certain embodiments of the invention are illustrated in the following drawings:

FIGS. 2A-2B, taken together, form a simplified flow diagram of steps of a method for fabricating Through Silicon Via (TSV) coils according to certain embodiments of the present invention.

FIG. 2C is a key to FIGS. 2A-2B.

FIGS. 13-17 are useful in understanding example methods for dense TSV coil process development and 8 TSV coil stacking for MEMs applications which methods are operative according to certain embodiments of the present invention, in particular:

FIG. 13 is a graph of current and magnetic field change with applied voltage.

FIG. 14 is a graph of modification of current and magnetic field with time under 1.679 volts.

FIG. 15 is a graph of Inductance performance with frequency of 8 stacking coils.

FIG. 16 is a table of Coil resistances of wafer level after front-side (Under Bump Metallization) UBM patterning.

FIG. 17 is a table of resistance values for 4 example coils.

FIGS. 18A-18B, taken together, form a simplified flow diagram of a process flow for fabricating Through Silicon Via (TSV) coils, using bulk Silicon, Glass or SoG (Silicon on Glass), or any other substrate material that is suitable for TSV technology as the surrounding substance of the coil.

FIG. 18C is a key to FIGS. 18A-18B.

FIGS. 20A-20B, taken together, illustrate stages of a generally self-explanatory process for generating a stack of coils so as to provide flux to e.g. so as to drive an axis in a mechanical device, all in accordance with certain embodiments of the present invention.

FIG. 20C is a key for FIG. 20B.

DETAILED DESCRIPTION OF CERTAIN EMBODIMENTS OF THE INVENTION

Figure 1:
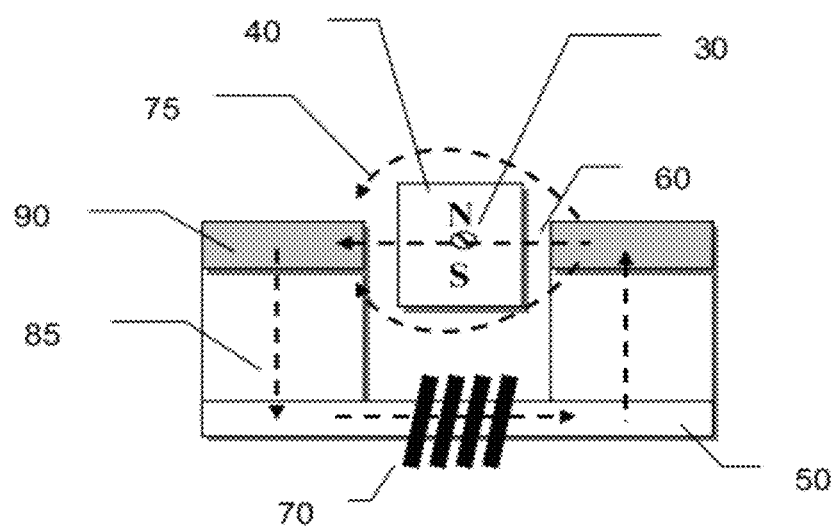
FIG. 1 is a simplified cross-sectional view of a prior art electromagnetic actuator.

Reference is made to FIG. 1 (Prior art), which illustrates a typical prior art electromagnetic actuation mechanism in cross-section. The electromagnetic actuator comprises a stator (i.e., non-rotating portion) and a rotor pivoting about an axis 30 along a route having a length of less than several dozen microns, the rotor comprising a flexure element fixedly associated with the stator, the flexure element comprising a magnetic portion 40; the stator comprising a Ferro-magnetic core 50 having a curved configuration which is almost closed thereby to define an air-gap 60 closing the curved configuration and having a width exceeding the route length by only a few microns and a conductive coil 70 wrapped around at least a portion of the almost closed curved configuration of the Ferro-magnetic core 50. At least the magnetic portion 40 of the flexure element is disposed within the air-gap 60, thereby to generate a first magnetic field in the air-gap 60 and an alternating current flows through the conductive coil 70 thereby to generate a second, alternating magnetic field within the air gap 60, the magnetic fields being indicated by arrows 75. The magnetic portion 40 is oriented such that the first magnetic field generated thereby in the air-gap 60, when interacting with the second, alternating magnetic field within the air-gap, generates a movement about the axis 30.

The conductive coil 70 of the electromagnetic actuator of prior art FIG. 1 induces electromagnetic flux, as indicated by arrows 85, which is typically directed by a flux director 90 and which drives the actuator.

The general model of the electromagnetic circuit can be deduced by Ampere law as an equilibrium of the applied electromagnetic force (on the left hand side) and the induced magnetic flux multiplied by the circuit reluctance (right hand side).

$$F = Ni = \phi(t) \mathfrak{R} \tag{1}$$

where N is the number of coil turns and i is the applied current. The dissipative power of the operation of the motor can be described by:

$$P = iV = i^2 R_{coil} \tag{2}$$

where R is the coil impedance that can be computed as:

$$R_{coil} = \frac{\rho L_c}{A_c} \tag{3}$$

where $L_c$ is the coil length, $A_c$ is the coil cross-section area and $\rho$ is the coil specific density. Hence the length of the coil is a function of the coil number of turns, estimating the length of each turn as a circumferential of a circle; the resistivity of a coil with N turns may be expressed as:

$$R_{coil} = \frac{\rho L_c}{A_c} \approx \frac{\rho \sum_{j=0}^{N-1} 2\pi(r_0 + jp)}{A_c} = \frac{\rho \pi N}{A_c}[2r_0 + (N-1)p] \tag{4}$$

and the overall power, per one layer of coil, with initial radius of r0 and pitch p as:

$$P = i^2 \frac{\rho \pi N}{A_c}[2r_0 + (N-1)p] \quad (5)$$

A prevalent method of making coil devices is by turning a conductive wire. An alternative method is by utilizing well known semiconductors compatible with processing of thin film. By using such processes for manufacturing coils, the cost of such devices can be reduced; better electromagnetic response and reliability can be achieved along with a simplified assembly process for other components, such as for electromagnetic actuators, as is known in the art. In current state-of-the-art fabrication methods for creation of such coils, thin layers are utilized for the creation of metal strips (the coil itself) and the surrounding substance material in which the coil is fabricated (usually, a passivation layer). The design of the coil is limited by this fabrication process e.g., thickness of metal cross-section is limited by the deposition thickness of the isolation layer (passivation layer e.g.).

However, in some applications, there is a need for high currents, low resistance and high inductance. In order to achieve these, a larger cross section of the coil is needed along with an increasing number of coil turns. This is not achieved in current state-of-the-art semiconductor thin layer compatible manufacturing techniques.

According to certain embodiments of the present invention, bulk micro-machining technology is used to create such coils, in various bulks, whose bulks may for example be formed of Silicon, Pyrex, or suitable polymers. In particular, Through Silicon Via (TSV) technology is utilized in a manner compatible with semiconductor processes. TSV realizes electrical contacts from one side of wafers to the other. The conductive contacts may be realized either (a) by using through wafer patterning (e.g., deep Silicon etch, or laser drilling) and filling with electroplated or deposited metal or conductive material (e.g., doped Poly-Silicon), or (b) by realizing a through via and covering the side walls with a conformal conductive layer.

In TSV processes the bulk material of the wafer is utilized as the surrounding substance of the coil, along with via making processes (e.g., TSV technology) to pattern the coils, allowing wire cross-section to be increased to desired parameters, and the coils to be engineered accordingly.

The conventional TSV process employs a temporary support wafer which is temporarily bonded to the processed wafer and de-bonded, after the process is completed, for further treatment such as dicing, packaging and assembly.

A fabrication process for TSV coils in accordance with certain embodiments of the present invention is now described with reference to FIGS. 2A-2B which, taken together, form a simplified flow diagram of a process flow for fabricating Through Silicon Via (TSV) coils, using bulk Silicon, e.g., as the surrounding substance of the coil. The third, rightmost column of FIGS. 2A-2B provides illustrations of the outcome of each stage in the process flow. The fabrication process typically includes some or all of the following stages and steps, suitably ordered e.g. as shown:

aa. Step 310—Initially, the surrounding substance material is patterned using deep Si etch, according to coil specifications such as but not limited to metal cross-section, number of turns, and pitch.

bb. Subsequently, in step 320, turns are isolated.

cc. Metallization of the coils (steps 330 to 350).

dd. In steps 360 to 400, connection feeds to the coil are patterned on both sides of the coil (in and out connections).

Steps 310-410 are now described in detail:

310: Performing deep Si etch
320: Passivation of the etched trenches
330: Seed layer process
340: Electroplating
350: Front side CMP
360: Front side passivation
370: Open contact in the passivation layer
380: Wafer polish/etch
390: Back side passivation
400: Open contact in the passivation layer
410: BGA process FIG. 2C is a key for the flow diagram of FIGS. 2A-2B.

Figure 3:
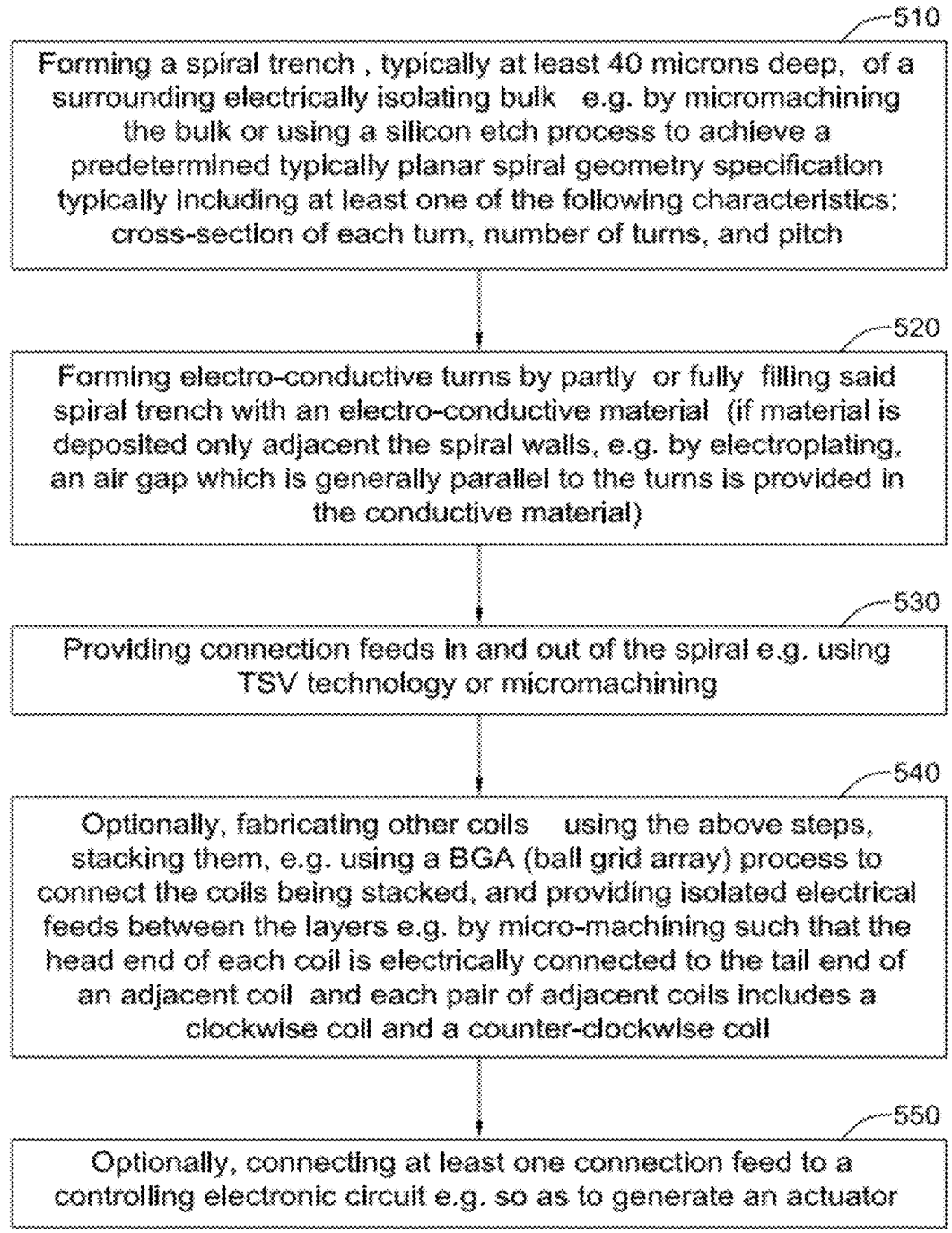
FIG. 3 is a simplified flowchart illustration of a general method for manufacturing an electric coil device operative according to certain embodiments of the present invention.

FIG. 3 is a simplified flowchart illustration of a general method for manufacturing an electric coil device operative according to certain embodiments of the present invention.

Figure 4:
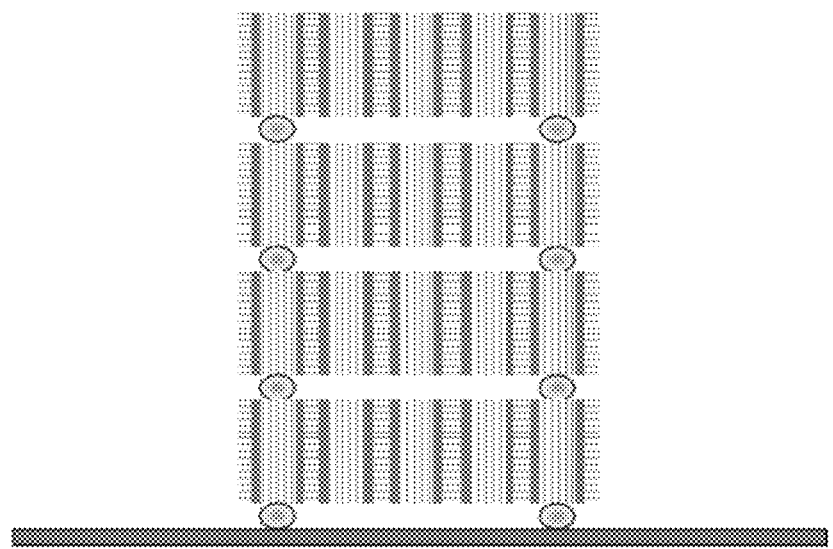
FIG. 4 is a simplified cross-sectional view of a coil structure with 4 layers of coils constructed and operative according to certain embodiments of the present invention.
Figure 5:
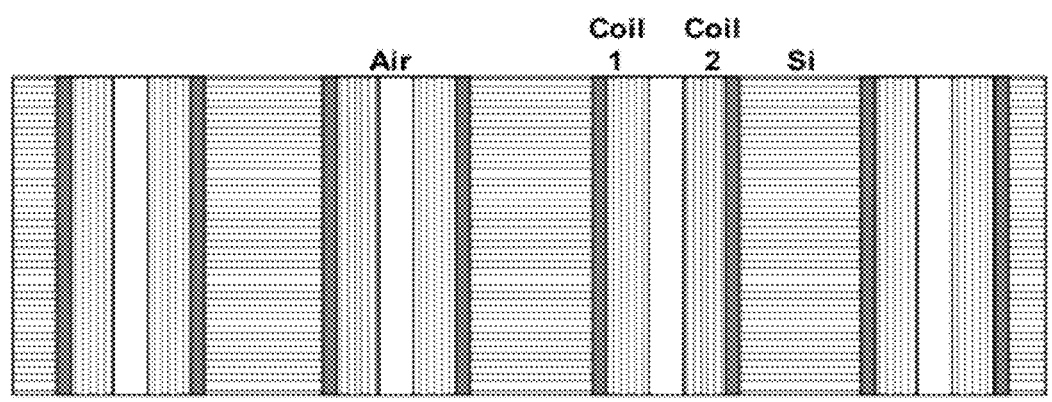
FIG. 5 is a simplified cross-sectional view of a coil structure with a double turn design constructed and operative according to certain embodiments of the present invention.

In order to increase the number of turns, multiple structures of coils can be assembled one on top of the other as illustrated in FIG. 4 which is a simplified cross-sectional view of a coil structure with 4 (say) layers of coils. Alternatively or in addition, an air gap can be provided in the middle of the conductive material's cross-section, so as to provide additional turns which are intertwined in one another, e.g. as shown in FIG. 5 which is a simplified cross-sectional view of a coil structure with double turns design which uses the same notation (e.g. for air and silicon) as FIG. 4.

Referring again to FIG. 3, the method for manufacturing an electric coil device according to certain embodiments of the present invention may include some or all of the following steps, suitably ordered e.g. as follows:

Step 510: forming a spiral trench, typically at least 40 microns deep, of a surrounding electrically isolating bulk e.g. by micromachining the bulk or using a silicon etch, e.g., to achieve a predetermined typically planar spiral geometry specification typically including at least one of the following characteristics: cross-section of each turn, number of turns, and pitch.

Step 520: forming electro-conductive turns by partly or fully filling the spiral trench with an electro-conductive material (if material is deposited only adjacent the spiral walls, e.g. by electroplating, an air gap which is generally parallel to the turns is provided in the conductive material).

Step 530: providing connection feeds in and out of the spiral e.g. using TSV technology or micromachining.

Figure 12A:
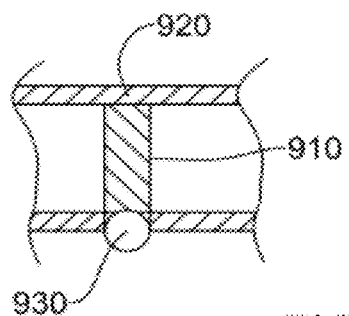
FIGS. 12A-12B are side view illustrations of BGA (ball grid array) process-formed connectors used to connect a coil device in a stack to a coil below it and above it, respectively, in the stack.
Figure 12B:
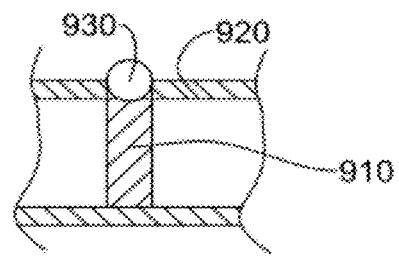

Step 540: optionally, fabricating other coils using the above steps, stacking them, e.g. using a BGA (ball grid array) process to connect the coils being stacked as shown in FIGS. 12A-12B, and providing isolated electrical feeds between the layers e.g. by micro-machining such that the head end of each coil is electrically connected to the tail end of an adjacent coil and each pair of adjacent coils includes a clockwise coil and a counter-clockwise coil.

Step 550: optionally, connecting at least one connection feed to a controlling electronic circuit e.g. so as to generate an actuator.

Figure 6:
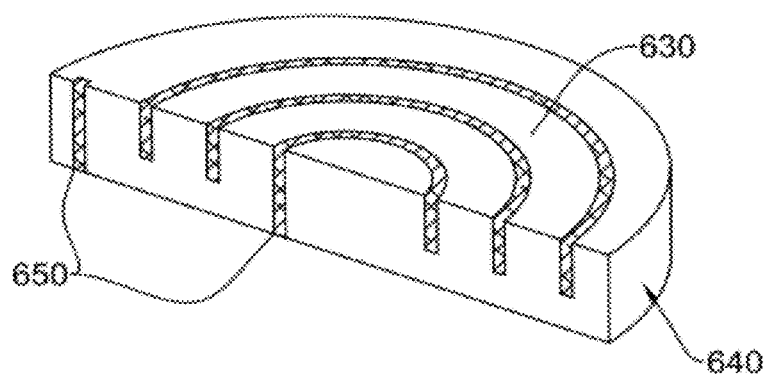
FIGS. 6-8 are respective isometric cut-away, cross-sectional and top view illustrations of an electric coil device constructed and operative in accordance with certain embodiments of the present invention.
Figure 7:
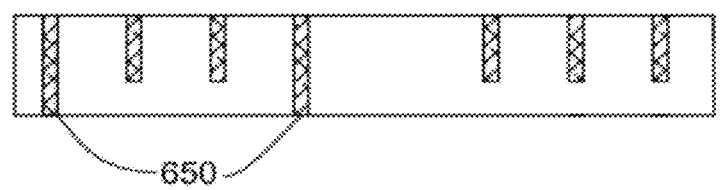
Figure 8:
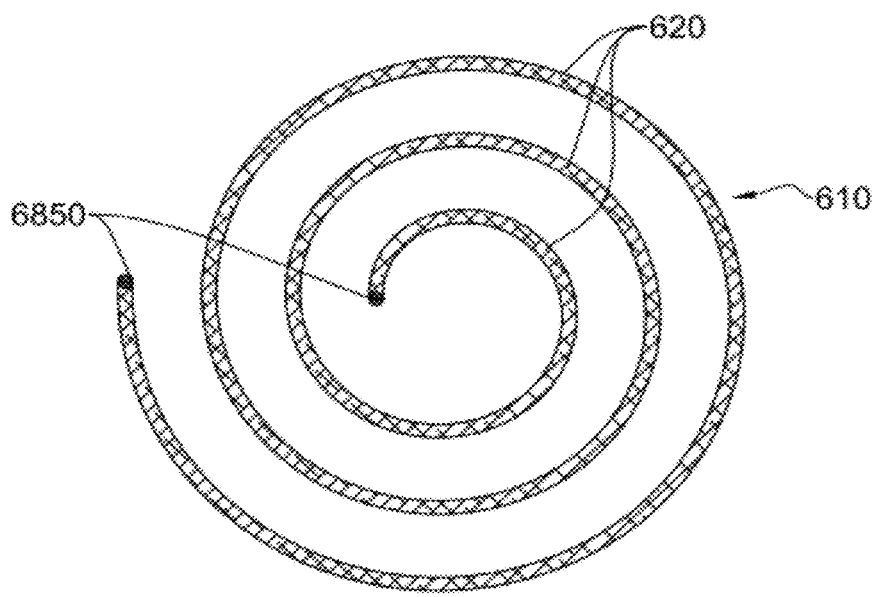

FIGS. 6-8 are simplified respective isometric cut-away, cross-sectional and top view illustrations of an electric coil device constructed and operative in accordance with certain embodiments of the present invention and including a spiral 610 comprising a plurality of electro-conductive turns 620 and an isolation layer 630 between the turns, the isolation layer comprising a spiral trench formed of a surrounding electrically isolating bulk 640, the electro-conductive turns comprising an electro-conductive material at least partly filling the spiral trench; and connection feeds 650 in and out of the spiral. The cross-sectional and cut-away views are cut along the axis connecting the connection feeds in FIG. 8.

Figure 9:
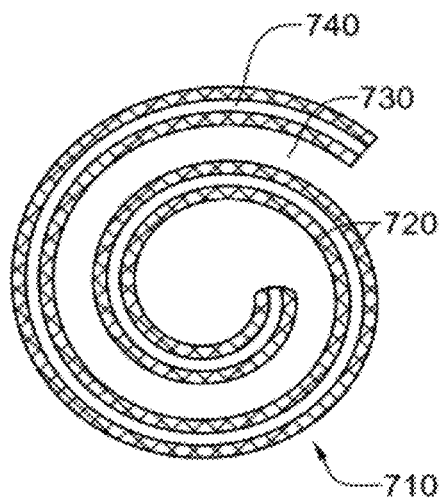
FIG. 9 is a simplified top view illustration of a spiral 710 comprising a plurality of electro-conductive turns 720 and an isolation layer 730 between the turns, the isolation layer being fabricated by forming a spiral trench of a surrounding electrically isolating bulk, and forming the electro-conductive turns by only partly filling the spiral trench with an electro-conductive material, thereby to form a spiral air gap 740 as shown.

FIG. 9 is a simplified top view illustration of a spiral 710 comprising a plurality of electro-conductive turns 720 and an isolation layer 730 between the turns, the isolation layer being fabricated by forming a spiral trench of a surrounding electrically isolating bulk, and forming the electro-conductive turns by only partly filling the spiral trench with an electro-conductive material, thereby to form a spiral air gap 740 as shown.

Figure 10:
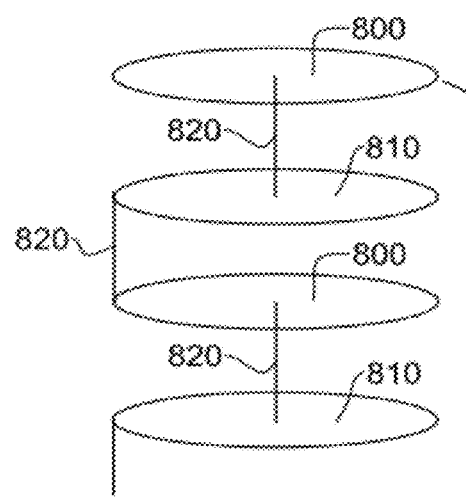
FIG. 10 is a simplified isometric illustration of a stack of coils including a first plurality of clockwise spiral conductive coils and a second plurality of counterclockwise spiral conductive coils wherein each pair of adjacent coils includes a clockwise coil and a counter-clockwise coil.
Figure 11A:
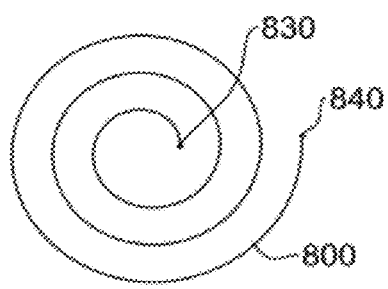
FIGS. 11A and 11B are top view simplified illustrations of respectively clockwise and counterclockwise spiral conductive coils, constructed and operative in accordance with certain embodiments of the present invention.
Figure 11B:
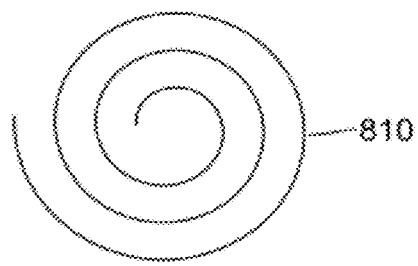

FIG. 10 is a simplified isometric illustration of a stack of coils including a first plurality of clockwise spiral conductive coils 800, e.g. as shown in top view in FIG. 11A, and a second plurality of counterclockwise spiral conductive coils 810, e.g. as shown in top view in FIG. 11B, wherein each pair of adjacent coils includes a clockwise coil and a counter-clockwise coil. Through-silicon vias 820 electrically connect an end, such as a head end 830 or tail end 840 (FIG. 11A) of each individual one of the first plurality of clockwise coils to an end, typically the same end (head or tail) of an individual one of the second plurality of counterclockwise coils and connect the other end of the individual one of the first plurality of clockwise coils to an end, typically the same end (tail or head), of another individual one of the second plurality of counterclockwise coils.

FIGS. 12A-12B are side view illustrations of BGA (ball grid array) process-formed connectors 910 used to connect a coil device in a stack to a coil below it and above it, respectively, in the stack. Isolation material is denoted by reference numeral 920 and the balls formed by the BGA process are denoted by reference numeral 930.

Example methods for dense TSV coil process development and 8 TSV coil stacking for MEMs applications are now described in detail.

In the illustrated example, a dense TSV coil and stacking process suitable for MEMs applications is shown. The dense TSV coils (20 um width, 10 um space, 90 um depth, in the illustrated example) are void-free filled by Cu. 8 layer coil stacking is provided, using conductive adhesive. The resistance, inductance, magnetic field, and basic reliability of 8 dense coils stacking in the illustrated example are described.

In the illustrated example, higher resistivity (30~40 Ohm·cm) substrates were used in the dense TSV coil process development for the reduction of RF substrate loss in the MEMs application. The full process included TSV coil process development, back side thin wafer process, bonding and de-bonding for the dense TSV coil, laser drilling for the center cavity formation and die stacking Dense TSV coil is etched by the DRIE. Two step etching was applied for the TSV coil and coil stacking connection.

Multiple DC plating steps were developed for the Cu void-free plating in deep TSV trench. High polishing rate CuCMP process was setup and applied in this development work. The coil performance in the wafer level was tested after front-side UBM process by probe station and HP 34401A multi-meter. The electric performance of the coil is shown in the table of FIG. 16. Adhesive polymer is used for the bonding of carrier wafer with TSV coil wafers after front side UBM processing.

After back-grinding to 120 um and exposing back side coil contact for the following on stacking, low temperature (150° C.) SiN was deposited and patterned at the passivation layer. Following the back side UBM process, laser drilling was used for the formation of the middle of the cavity. After de-bonding from EVG supporting and dicing, conductive adhesive was used for 8 chip stacking, thereby to generate a void-free Cu filling TSV coil.

Figure 13:
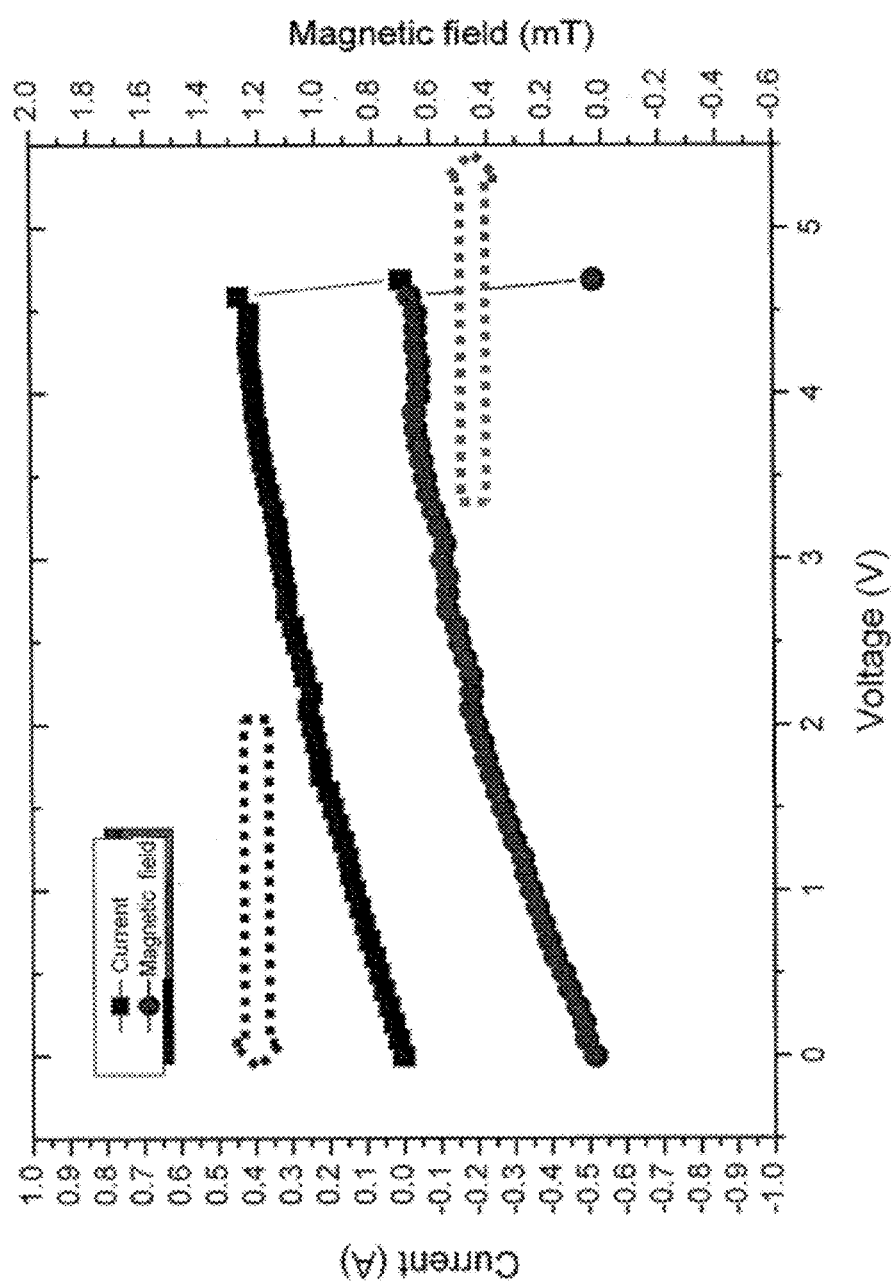
Figure 14:
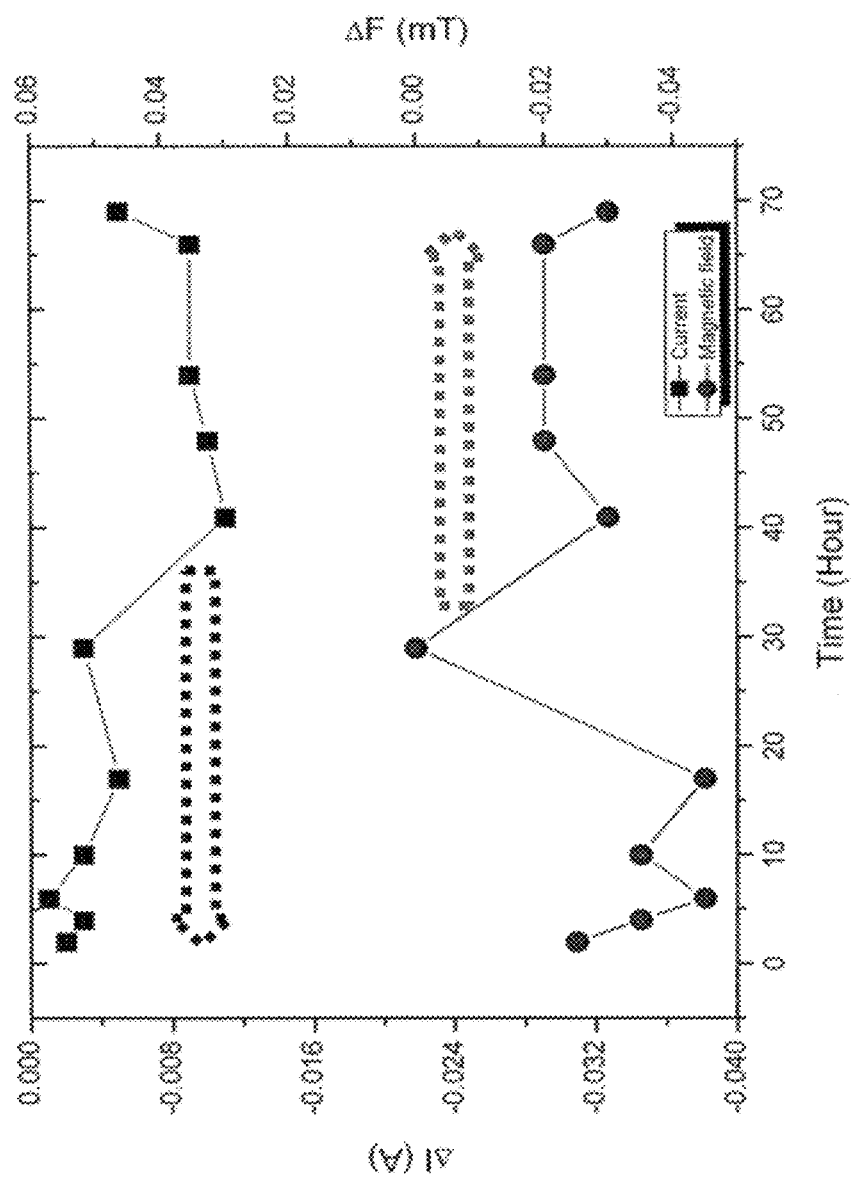
Figure 15:
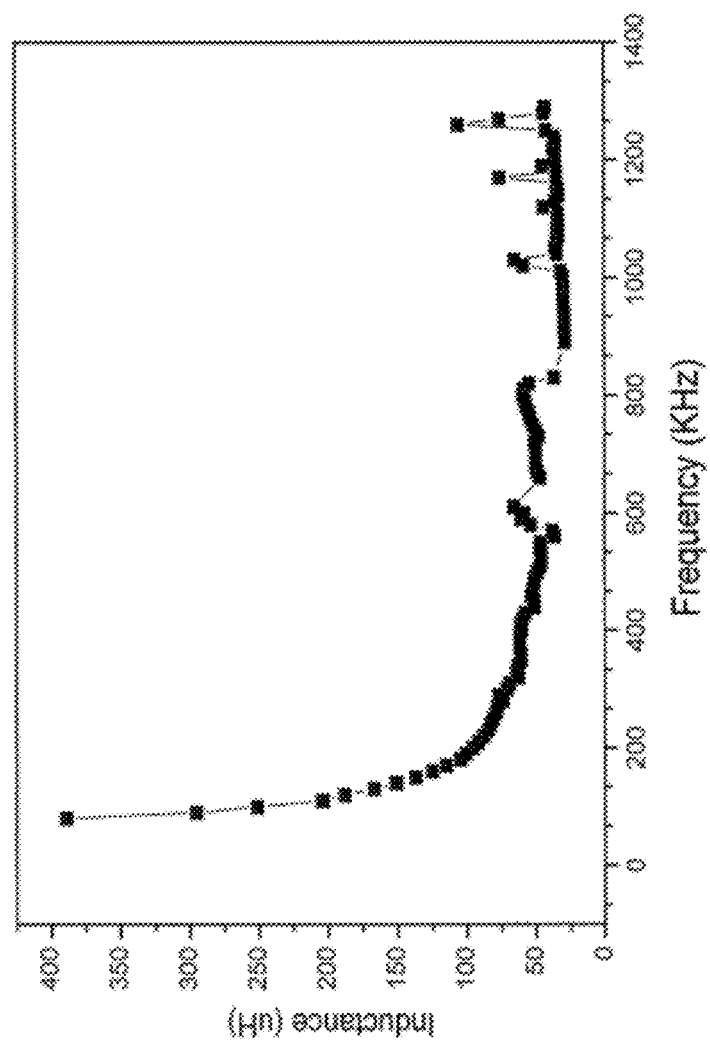

The resistances of coils after 8 layer stacking are measured and shown in FIG. 17. The measured resistances include contact resistance and conductive adhesive resistance. The 8 coils stacking resistance is matched with wafer level coil 0.9 Ohm. I-V performance and magnetic field of 8 layer coil stacking were measured using an Agilent E3631A Triple Out DC Power supply and a 475 DSP Gauss-meter. The distance between the magnetic field detection and the 8 coil stacking center is around 2 mm. The magnetic field and current changing with applied voltage are shown in FIG. 13. The magnetic field of the 8 layer coils stacking saturates from 4V. The linear I-V curve of 8 stacking coils is shown in FIG. 13. The breakdown voltage of 8 stacking coils is 4.6V from this coil measurement. This system was used to measure the basic reliability performance of 8 layer stacking coils. 1.697V was applied on the 8 stacking coils and the current and magnetic field was measured with time. The measurement results are shown in FIG. 14. After 66 hours testing, the variation of current and magnetic fields were ~5-%, ~10% respectively. The reliability of 8 dense TSV coil stacking was improved. Inductance is believed to be an important factor for the 8 stacking coils. The inductance of 8 coils stacking is measured by 4285 A 75 KHZ-300 MHZ Precision LCR Meter under 1V voltage. The variation of inductance with frequency is shown in FIG. 15. The maximum value of 8 stacking coils inductance is 389uH at 80 KHz. But inductance of 8 dense TSV coils stacking reduces to ~30 uH from 0.8 MHz to 1.3 MHz.

In the illustrated example of a dense TSV coil process with void-free Cu filling, then, a thin wafer process is applied on the back side of a dense TSV coil. Laser drilling is used for deep cavity formation. An 8 dense TSV coils stacking functionality is provided. The electric and magnetic fields of 8 stacking coils were measured as described above. The 8 layer coils stacking can pass 66 hours electric stress testing under 0.19 A.

A fabrication process for TSV coils in accordance with certain embodiments of the present invention is now described with reference to FIGS. 18A-18B which, taken together, form a simplified flow diagram of a process flow for fabricating Through Silicon Via (TSV) coils, using bulk Silicon, Glass or SoG (Silicon on Glass), or any other substrate material that is suitable for TSV technology as the surrounding substance of the coil; the same materials may be used for the process of FIGS. 2A-2B. The third, rightmost column of FIGS. 18A-18B provide illustrations of the outcome of each stage in the process flow. The method and of FIGS. 18A-18B and key of FIG. 18C may be as described above with reference to the method and key of FIGS. 2A-2C, respectively, with corresponding reference numerals indicating similar steps, except for the following differences:

Step 1310—as in FIGS. 2A-2B, initially, the surrounding substance material is patterned using a suitable etch process, according to coil specifications such as but not limited to metal cross-section, number of turns, and pitch. However, different width dimensions of the photolithography mask are used to yield varying depths for the trench and a wide width results in a deeper trench. Here and in step 310 of FIGS. 2A-2B, a deep Si etch, or RIE (Reactive Ion Etch), or DRIE (Deep RIE), or a wet etch, or any other etch process can be performed in order to create the vias.

In step 1340 (and in step 340 of FIGS. 2a-2b), optionally, an air gap which is generally parallel to the turns is provided in the conductive material by growing an electroplating layer on the trench walls e.g. as shown in FIG. 9.

At step 1370 as well as at step 1400, optionally, UBM may be applied for the fabrication.

Step 1410: The BGA process may be finished with a reflow.

FIGS. 18A-18B pertains to one example spiral coil, with particular location of TSV (holes bound by BGA) i.e., from left to right, deep, shallow, shallow, hole, deep, shallow, shallow. However, this structure is of course merely exemplary. For example, the beginning and/or end of the trench may be in different locations. For example, given a mirror image with respect to the vertical axis, of the cross-section shown in FIGS. 18A-18B, the beginning of the trench may be on the right hand side of the trench.

Referring again to FIG. 3, it is appreciated that the spiral trench may have any suitable depth, such as but not limited to 5 to 100 microns deep and may be generated e.g. by micro-machining the bulk or using or any etch process suitable for fabrication of the vias.

The width of the spiral trench is typically not constant, typically having a higher value e.g. of 10-50 microns at the peripheral and central trench portions, and a lower value e.g. of 5-20 microns along the intermediate portion disposed between the peripheral and central trench portions. The varying width of the trench yields a varying aspect-ratio for the trench cross section. During the DRIE process, the depth of the trench in the substrate bulk is determined from the width of the photolithography mask. Consequently, a wide width results in a deeper trench. The difference of the trench depths can be defined by considering, inter alia, the cross section's aspect ratio (AR). The AR along the narrow part of the trench is 5/1 while the AR in the edges of the trench is less than 2/1.

Usually, in MEMS designs, structures with different dimensions and aspect ratios coexist on a single microchip. When the structures that are formed inside the bulk material are deep (e.g. a depth of several microns, say 10-100 microns deep), the process is called "a deep silicon etching process". As opposed to other etching methods, this process generates 'slots' in the material whose depth greatly exceeds their width. The ratio between the trench's depth and its width, i.e. its aspect ratio, is greater than 1 for deep silicone etching processes. In the deep etching process an ARDE (aspect ratio dependent etching) effect is known. For features with different dimensions etched simultaneously, the ARDE effect causes larger features to be etched faster. Therefore, time is also typically a factor taken into consideration when determining a mask width suitable for a desired structure depth.

After the DRIE phase, a metal layer is filled inside the trench e.g. using a conventional electroplating process. Finally, when the bottom side of the substrate is polished/etched, the deep trench is exposed such that these edges, that are now filled with metal, enable a transition of conductivity between the top and bottom layers of the substrate, and hence vertical stacking of coils is possible.

The connection feeds are typically formed such that each coil has a first connection feed in the upper surface of the substrate and a second connection feed at the bottom surface of the substrate. This design enables connection of an array of coils in a vertical structure e.g. stack, comprising as many layers as required. The electrical connection of the stacked-coils structure is such that one end of the electrical connection is attached to the stack's top surface and the other end of the electrical connection is attached to the stack's bottom surface.

The fabrication process of the connection pads may comprise a conventional UBM process and may include some or all of the following operations: After the passivation layer on the upper surface of the substrate, open contacts are effected at specific locations on the passivation layer. Then, metal layers (e.g. Aluminum, Gold, Titanium, Nickel but not limited to these specific materials) are dissipated at these locations, so as to form the connection pads. This process is typically performed separately from the fabrication process of the trench so as to be less complicated.

Connecting between two (or more) UBM pads that belong to different substrates may be effected by applying solder material using suitable technologies such as, but not limited to BGA or Metal evaporation, typically on top of the UBM layer. Connection between these layers may be effected by positioning two (or more) substrates, one on top of the other, and by means such as, e.g. by applying force or using a reflow process.

Solder bumps are typically formed at a preliminary step in the fabrication process of the coils, and may be used for interconnecting layers of a semiconductor device. According to certain embodiments, solder bumps are fabricated at four locations of the coil (two in the top layer and another two in the bottom layer) as shown (the four spherical elements in FIG. 18D). However, according to other embodiments, depending on the application, the type of connection (in series or in parallel), and other possible factors, solder bumps may be formed at other locations and/or at less than all of the above locations e.g. in the embodiment of FIG. 20 which requires only two connections, one in the upper layer and another in the bottom layer.

The design and fabrication process of the coils typically comprises creating a hollow aperture in the center of the coil, and enabling insertion of a ferromagnetic material for the creation of an electro-magnetic force, by means of an electromagnetic flux. Electromagnetic flux is increased, advantageously, by more ferromagnetic material being placed in the coil center, e.g. by placing a ferromagnetic body which extends throughout the substrate.

Figures 18D, 18E:
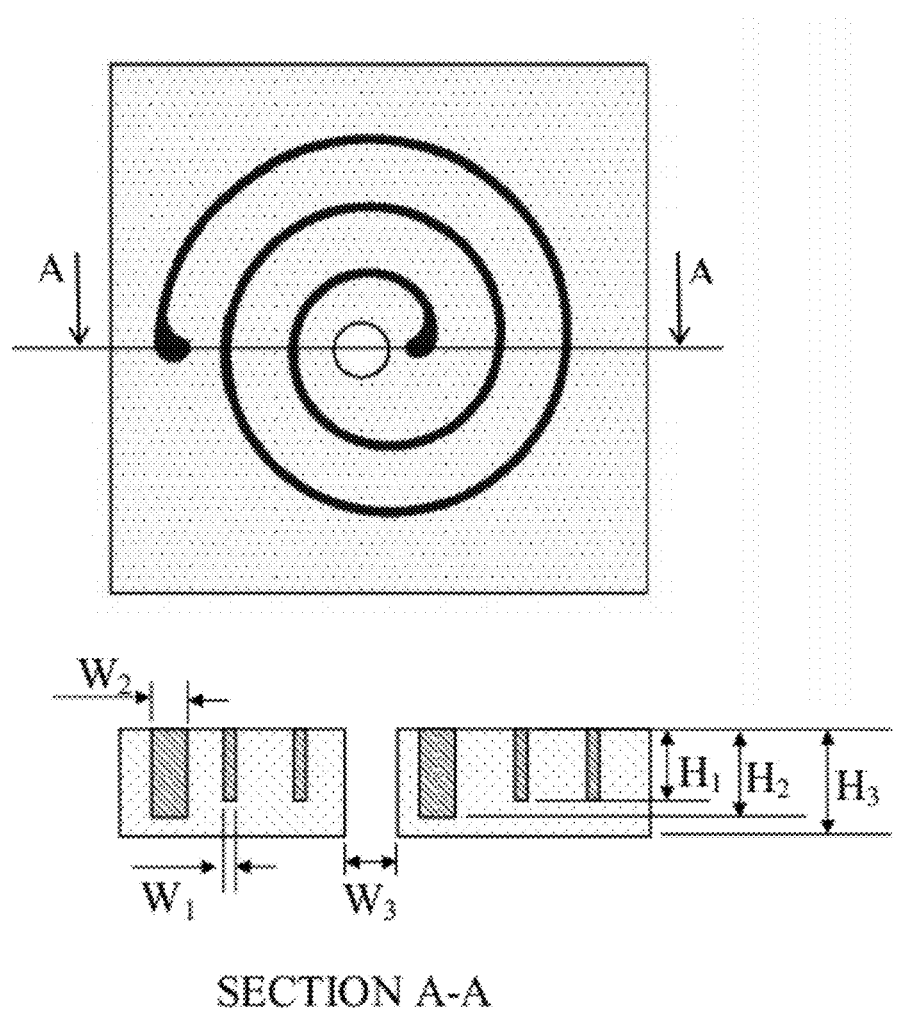
FIG. 18D is a top view of a substrate formed of a bulk material.
FIG. 18E is a key for the top view and sectional illustrations of FIG. 18D.

FIG. 18D is a top view of a substrate formed of a bulk material, with a spiral trench revolving around a central core and, below the top view, a cross-sectional illustration taken along the line A-A, of the spiral trench. The spiral trench may be formed by the method of FIGS. 18A-18B. Shallow and narrow, medium, and deep and wide trench portions are shown, having widths and heights of W1 and H1, W2 and H2, and W3 and H3, respectively. Typically at least one end of the spiral trench, such as the peripheral or central end thereof, or both as in the illustrated embodiment so as to enhance the number of connection possibilities, is/are deeper (hence wider) than the centrally located portion.

As shown, the trench includes a centrally located portion which is wide and long/high enough (W3, H3) to serve as a portion of the hollow core, in which a ferromagnetic body may reside. The hollow core typically extends the length (perpendicularly to the plane of the page) due to the centrally located trench portion being long enough (H3) to adjoin other hollow core portions of H3 length which may be formed by other spirals stacked under or over the spiral of FIG. 18D thereby to form a single hollow core extending along the entire length of the stack. Portions of width W2 and length/height H2 are typically wide enough hence long enough to serve as vias. W2, H2 may equal or be somewhat less than W3, H3 respectively. Portions of width W1 and/height H1 are narrow hence short enough to preserve insulation (e.g. due to intervening silicon) between similar layers of substrate above and below them.

EXAMPLE

W1=20, W2=50, W3=250, H1=110, H2=120, H3=130,

FIG. 18E is a key for the top view and sectional illustrations of FIG. 18D.

The ratio between the intermediate portion to the beginning and end portions may vary as required, and may for example be 99% and 1%, or 70% and 30%.

Figure 19A:
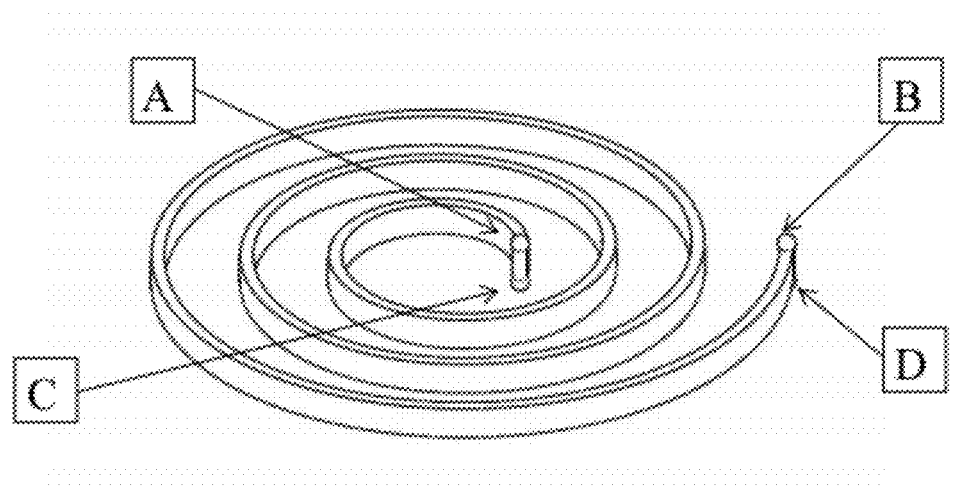
FIG. 19A is a perspective illustration of an example spiral trench constructed and operative in accordance with certain embodiments of the present invention.

According to certain embodiments, the connection of a coil or stack to a voltage source and/or circuit can be effected from either its upper or lower surfaces (top and bottom coils respectively), providing versatility. For example:

FIG. 19A is a perspective illustration of an example spiral trench constructed and operative in accordance with certain embodiments. Elements denoted A, B, C, D denote the connecting points of the coil, typically with associated BGA "balls". In the illustrated embodiment two connecting points are provided on the upper surface of the trench and two on the lower surface, providing diverse options for connectivity e.g. as described in FIGS. 19B-19C. Connections may then be provided so as to suit the desired current direction and other aspects of the application.

Figure 19B:
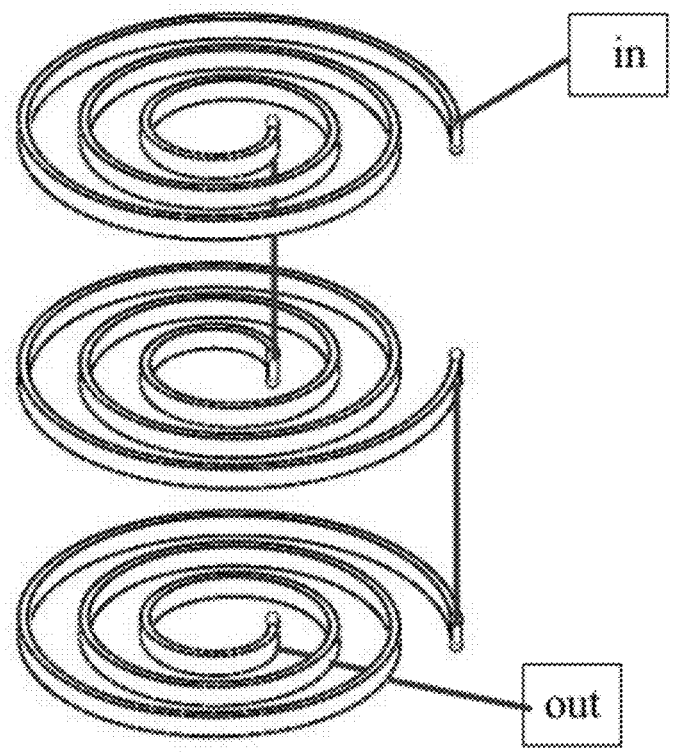
FIGS. 19B and 19C are respective perspective illustrations depicting various electrical connections, in schematic form, between stacked coils defining a counterclockwise and clockwise current direction, respectively, all in accordance with certain embodiments of the present invention.
Figure 19C:
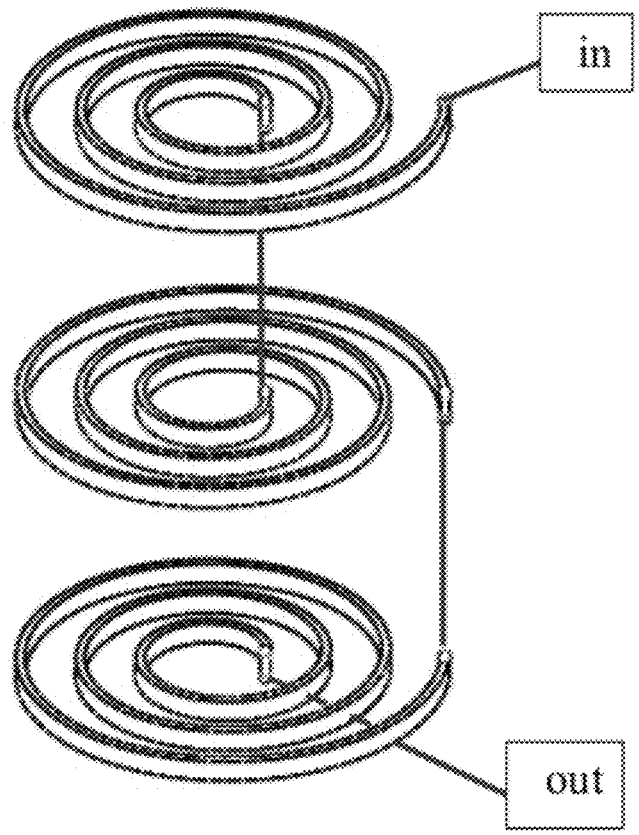

FIGS. 19B and 19C are respective perspective illustrations depicting various electrical connections, in schematic form, between stacked coils defining a counterclockwise and clockwise current direction, respectively.

In FIG. 19B, the three coils are stacked such that the current direction is counter-clockwise. The upper coil is connected to the current source through point B. Point C at the upper coil is connected to point A of the middle coil. Point D in the middle coil is connected to point B of the bottom coil. Point C of the middle coil is connected to the remainder of the electrical circuit. It is appreciated that alternatively, the current source may be connected to point A of the upper coil, yielding a clockwise current direction. In this case, the connection between the coils may be as follows: Point D of the upper coil connected to the middle coil at point B; middle coil connected at point C to the bottom coil at point A; point D of the bottom coil connected to the remainder of the electrical circuit.

FIG. 19C depicts stacking of three coils such that the current direction is clockwise. The upper coil is connected to the current source through point B. Point C at the upper coil is connected to point A of the middle coil. Point D in the middle coil is connected to the point B of the bottom coil. Point C at the bottom coil is connected to the remaining electrical circuit.

FIGS. 20A-20B, taken together, illustrate a generally self-explanatory process for generating a stack of coils so as to provide flux to e.g. so as to drive an axis in a mechanical device.

Regarding step 1305, the mask width is selected to achieve the required depth, as is known in the art, based inter alia on the material being etched, time for the process, the material used for the etching, and many more. Etching rate dependency on aspect ratio is described, for example, in Gottscho, Jurgensen and Vitkavage, "Possible mechanisms for aspect ratio dependent etching rates", J. Vac Sci Technol B, 10, 2133 (1992).

Regarding step 1420, the number of coils to be stacked is determined per application. The required energy or force or torque for a particular application is known and one can be computed from the other as is known in the art. From the required energy and the input current, the required inductance of the inductor (coil) is found. When coils are connected in series, the equivalent inductance is known to be the sum of the individual coil's inductances such that the number of coils which need to be stacked may be determined, given the application.

Figure 21:
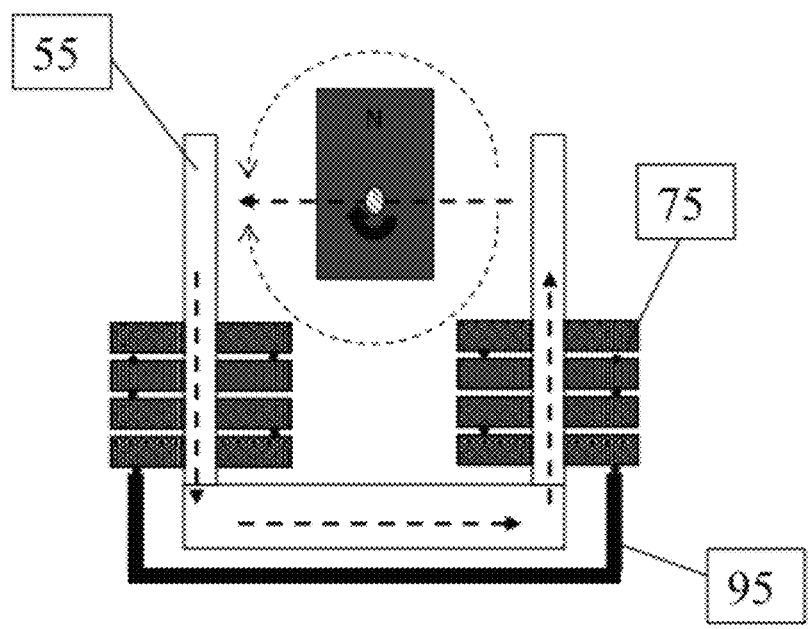
FIG. 21 is a simplified cross-sectional view of an example electromagnetic actuator constructed and operative according to certain embodiments of the present invention.

FIG. 21 is a simplified cross-sectional view of an example electromagnetic actuator constructed and operative according to certain embodiments. As opposed to the prior art electromagnetic actuator of FIG. 1, the ferromagnetic material 50 of FIG. 1 is replaced by a narrow U-shaped ferromagnetic element 55. For example, the diameter of the ferromagnetic material may be 200-500 microns, or higher or lower (but typically not below 5 microns) depending on the intensity of the magnetic flux.

A coil structure 75 may for example comprise a pair of 4-floor (say) stack of coils, which together form a common cut-through hole about their central axes within which the arms of the U-shaped ferromagnetic element 55 may reside. The stacked-coils are typically threaded on the ferromagnetic material. Connection between the coils and the electrical circuit may be performed using BGA 95 which may be formed in an integral part of the production process of the coils. It is appreciated that a particular advantage of the embodiment of FIG. 21 is its small foot-print. The coils are connected in series but are located one on top of the other; consequently, the foot-print is small.

The applicability of the invention includes but is not limited to devices which are manufactured based at least partly on semiconductor processes, and applications that use induction to produce an electro-magnetic field, including moveable components or other components that use an electromagnetic field for their functionality. For example, miniature MEMS-based devices such as but not limited to projectors, may be provided in which at least one axis is driven by an Electro-Magnetic (EM) motor. The electric circuit for the motor may include magnets, coil/s (also termed herein "spirals") in which a ferromagnetic material resides and a current source. The current that flows in the coils generates an axis-driving magnetic field, due to the presence of the ferromagnetic material. Certain embodiments of the present invention may be used to generate the coil/s or "spirals" in which the ferromagnetic material resides.

According to an embodiment of the present invention, only one metal line is connected to the device, whereas an output metal wire is connected at the bottom side. A 'cut-through' hole (TSV) goes from the top to the bottom surface of the matrix, e.g. as shown and described herein, generating the driving circuit.

The height or depth of the device is typically indicative of the number of layers of coils that are stacked, if the technology used to generate the trenches imposes a technological limitation on the depth of the trench. For example, if trenches can be no deeper then 100 microns whereas the device's thickness is more than, say, 100-150 microns, the device typically comprises more than one layer.

It is appreciated that the coils need not be a separate stand-alone component and may be part of a larger system. For example, as part of designing of an Integrated-Circuit (IC), a spiral or coil as shown and described herein may be utilized as a component in (say) the top layer of the integrated circuit, whereas other components, located at other layers of the silicone, may or may not be as shown and described herein.

Any dimensions stipulated herein are merely by way of example. For example, IC designs may be a few orders of magnitude smaller than the dimensions specifically stipulated herein. For example, the thickness of a, say, metal layer in IC technology is ~1800 Angstrem whereas the dimensions stipulated herein assume a metal layer which may be about 100-120 microns thick.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting. It is appreciated that in the description and drawings shown and described herein, functionalities described or illustrated as systems and sub-units thereof can also be provided as methods and steps therewithin, and functionalities described or illustrated as methods and steps therewithin can also be provided as systems and sub-units thereof. The scale used to illustrate various elements in the drawings is merely exemplary and/or appropriate for clarity of presentation and is not intended to be limiting.

The invention claimed is:

1. An electric coil device comprising:
   a spiral comprising a plurality of electro-conductive turns and an isolation layer between the turns, the isolation layer comprising a spiral trench of varying width formed of a surrounding electrically isolating bulk, the electro-conductive turns comprising an electro-conductive material at least partly filling said spiral trench; and connection feeds in and out of the spiral,
   wherein the spiral is generally planar defining a coil plane and wherein the feeds extend both upward and downward from said coil plane, and
   wherein the trench which varies in height includes a peripheral portion, an intermediate portion and a central portion and wherein the cross-sectional height of the intermediate portion is greater than the cross-sectional heights, e.g. common cross-sectional height if equal, of the peripheral and central portions.

2. A device according to claim 1 in which the bulk is formed of one of the following group of materials: Silicon, Pyrex, Polymer.

3. Electronic circuitry apparatus including a coil device according to claim 1.

4. Electronic circuitry apparatus according to claim 3 which includes a plurality of coils and is operative to induce electromagnetic flux coupling.

5. Multi-level electrical coil apparatus comprising a stack of electrically connected electric coil devices according to claim 1.

6. Apparatus according to claim 4 which comprises an electromagnetic actuator.

7. A device according to claim 1 wherein the trench which varies in height includes a peripheral portion, an intermediate portion and a central portion and wherein the cross-sectional height of the intermediate portion is greater than the cross-sectional heights, e.g. common cross-sectional height if equal, of the peripheral and central portions.

8. Apparatus according to claim 5 wherein the spiral in each electric coil device has top and bottom main surfaces and defines a hollow portion at its center extending through the top and bottom main surfaces such that the stack has a hollow center comprising a concatenation of the hollow portions of each of the electric coil devices as stacked.

9. Apparatus according to claim 8 and also comprising a ferromagnetic structure residing in the hollow center of the stack and extending along a plurality of the electric coil devices in the spiral.

10. A device according to claim 1 wherein a plurality of connecting points are provided on at least one of the upper surface of the trench and the lower surface thereof, thereby providing diverse options for connectivity.

11. A device according to claim 1 wherein connecting points are provided at both ends of the trench on both the upper and lower surfaces of the trench, thereby providing diverse options for connectivity.

12. Apparatus according to claim 9 which includes electrical connection apparatus between the stack and an electrical circuit, thereby to generate an actuator.

13. An electric coil device comprising:
   a generally planar spiral defining a coil plane and comprising a plurality of electro-conductive turns and an isolation layer between the turns, the isolation layer comprising a spiral trench of varying width formed of an electrically isolating material, the electro-conductive turns comprising an electro-conductive material at least partly filling said spiral trench; and
   connection feeds in and out of the spiral which extend both upward and downward from said coil plane,
   wherein the spiral in each electric coil device has top and bottom main surfaces and defines a hollow portion at its center extending through the top and bottom main surfaces such that the stack has a hollow center comprising a concatenation of the hollow portions of each of the electric coil devices as stacked.

14. Multi-level electrical coil apparatus comprising a stack of electrically connected electric coil devices according to claim 1.

15. Apparatus according to claim 13 and also comprising a ferromagnetic structure residing in the hollow center of the stack and extending along a plurality of the electric coil devices in the spiral.

16. A device according to claim 1 wherein a plurality of connecting points are provided on at least one of the upper surface of the trench and the lower surface thereof, thereby providing diverse options for connectivity.

17. A device according to claim 1 wherein connecting points are provided at both ends of the trench on both the upper and lower surfaces of the trench, thereby providing diverse options for connectivity.

18. Apparatus according to claim 15 which includes electrical connection apparatus between the stack and an electrical circuit, thereby to generate an actuator.

* * * * *